United States Patent
Yang et al.

(10) Patent No.: US 10,056,264 B2
(45) Date of Patent: Aug. 21, 2018

(54) ATOMIC LAYER ETCHING OF GAN AND OTHER III-V MATERIALS

(71) Applicant: Lam Research Corporation, Fremont, CA (US)

(72) Inventors: Wenbing Yang, Fremont, CA (US); Tomihito Ohba, Chiba (JP); Samantha Tan, Fremont, CA (US); Keren Jacobs Kanarik, Los Altos, CA (US); Jeffrey Marks, Saratoga, CA (US); Kazuo Nojiri, Tokyo (JP)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/173,358

(22) Filed: Jun. 3, 2016

(65) Prior Publication Data

US 2016/0358782 A1    Dec. 8, 2016

Related U.S. Application Data

(60) Provisional application No. 62/171,570, filed on Jun. 5, 2015.

(51) Int. Cl.
*H01L 21/3065* (2006.01)
*H01L 29/20* (2006.01)
(Continued)

(52) U.S. Cl.
CPC ...... *H01L 21/30621* (2013.01); *H01J 37/321* (2013.01); *H01J 37/32706* (2013.01);
(Continued)

(58) Field of Classification Search
None
See application file for complete search history.

(56) References Cited

U.S. PATENT DOCUMENTS 5,482,802 A    1/1996  Celler et al.
5,527,425 A *  6/1996  Hobson ............ H01L 21/30621
                                                     257/E21.222
(Continued)

FOREIGN PATENT DOCUMENTS

WO    WO 2011/081921 A2    7/2011

OTHER PUBLICATIONS

G.DeSalvo et al.; Controlled Digital Etching of GaAs for Precise Gate Recess Formation in MESFET, HEMT and pHEMT Device Fabrication; 1996; http://csmantech.pairserver.com/newsite/gaasmantech/Digests/1996/papers/1996%202.2%20controlled%20digital%20etching%20gaas.pdf.*

(Continued)

*Primary Examiner* — Allan Olsen
(74) *Attorney, Agent, or Firm* — Weaver Austin Villeneuve & Sampson LLP

(57) ABSTRACT

Provided herein are ALE methods of removing III-V materials such as gallium nitride (GaN) and related apparatus. In some embodiments, the methods involve exposing the III-V material to a chlorine-containing plasma without biasing the substrate to form a modified III-V surface layer; and applying a bias voltage to the substrate while exposing the modified III-V surface layer to a plasma to thereby remove the modified III-V surface layer. The disclosed methods are suitable for a wide range of applications, including etching processes for trenches and holes, fabrication of HEMTs, fabrication of LEDs, and improved selectivity in etching processes.

20 Claims, 7 Drawing Sheets

(51) Int. Cl.
H01L 29/205 (2006.01)
H01L 29/778 (2006.01)
H01L 29/66 (2006.01)
H01L 21/67 (2006.01)
H01J 37/32 (2006.01)
H01L 21/306 (2006.01)
H01L 29/10 (2006.01)

(52) U.S. Cl.
CPC .. *H01L 21/67207* (2013.01); *H01J 2237/334* (2013.01); *H01L 29/1066* (2013.01); *H01L 29/2003* (2013.01); *H01L 29/66462* (2013.01); *H01L 29/7786* (2013.01)

(56) References Cited

U.S. PATENT DOCUMENTS

| | | | |
|---|---|---|---|
| 5,789,265 A * | 8/1998 | Nitta | H01L 33/007 438/22 |
| 5,814,239 A * | 9/1998 | Kaneko | H01L 21/30621 216/37 |
| 6,635,965 B1 | 10/2003 | Lee et al. | |
| 6,844,258 B1 | 1/2005 | Fair et al. | |
| 6,933,242 B1 * | 8/2005 | Srinivasan | H01L 21/30621 216/67 |
| 7,005,372 B2 | 2/2006 | Levy et al. | |
| 7,141,494 B2 | 11/2006 | Lee et al. | |
| 7,416,989 B1 | 8/2008 | Liu et al. | |
| 7,589,017 B2 | 9/2009 | Chan et al. | |
| 7,772,114 B2 | 8/2010 | Chan et al. | |
| 7,955,972 B2 | 6/2011 | Chan et al. | |
| 8,048,805 B2 | 11/2011 | Chan et al. | |
| 8,058,170 B2 | 11/2011 | Chandrashekar et al. | |
| 8,124,505 B1 * | 2/2012 | Burnham | H01L 21/30621 257/E21.407 |
| 8,124,531 B2 | 2/2012 | Chandrashekar et al. | |
| 8,551,885 B2 | 10/2013 | Chen et al. | |
| 8,808,561 B2 | 8/2014 | Kanarik | |
| 8,883,028 B2 | 11/2014 | Kanarik | |
| 9,230,818 B2 * | 1/2016 | Moustakas | H01L 21/3065 |
| 9,362,163 B2 | 6/2016 | Danek et al. | |
| 9,378,970 B2 * | 6/2016 | Joubert | H01L 21/67069 |
| 9,570,317 B2 * | 2/2017 | Posseme | H01L 21/306 |
| 9,570,600 B2 * | 2/2017 | Lu | H01L 29/66462 |
| 9,675,811 B2 | 6/2017 | Stahmann et al. | |
| 9,806,252 B2 | 10/2017 | Tan et al. | |
| 2003/0015704 A1 * | 1/2003 | Curless | C30B 25/18 257/69 |
| 2006/0051959 A1 | 3/2006 | Iwatake et al. | |
| 2009/0236693 A1 * | 9/2009 | Moustakas | H01L 21/30621 257/615 |
| 2009/0289263 A1 * | 11/2009 | Duong | H01L 33/08 257/77 |
| 2010/0291751 A1 | 11/2010 | Lee et al. | |
| 2011/0139748 A1 * | 6/2011 | Donnelly | H01J 37/32036 216/37 |
| 2011/0151635 A1 | 6/2011 | Liu et al. | |
| 2011/0192820 A1 | 8/2011 | Yeom et al. | |
| 2013/0099277 A1 * | 4/2013 | Speck | H01L 33/0079 257/101 |
| 2013/0200391 A1 * | 8/2013 | Bedair | H01L 21/0237 257/76 |
| 2013/0313561 A1 * | 11/2013 | Suh | H01L 29/402 257/76 |
| 2014/0061861 A1 * | 3/2014 | Moustakas | H01L 21/3065 257/615 |
| 2014/0170853 A1 | 6/2014 | Shamma et al. | |
| 2014/0335666 A1 * | 11/2014 | Koehler | H01L 29/66462 438/172 |
| 2015/0037972 A1 | 2/2015 | Danek et al. | |
| 2015/0228495 A1 * | 8/2015 | Joubert | H01L 21/67069 438/714 |
| 2016/0013063 A1 | 1/2016 | Ranjan et al. | |
| 2016/0064244 A1 | 3/2016 | Agarwal et al. | |
| 2016/0293437 A1 * | 10/2016 | Zhou | H01L 21/0337 |
| 2016/0358782 A1 * | 12/2016 | Yang | H01L 21/3065 |
| 2017/0069462 A1 * | 3/2017 | Kanarik | H01J 37/321 |
| 2017/0229311 A1 | 8/2017 | Tan et al. | |

OTHER PUBLICATIONS

Eric Higham; The Compound Semiconductor Industry; How Did It Get Here and Where Is It Going?; SemiCon WEST Jul. 12-14, 2016 http://www.semiconwest.org/sites/semiconwest.org/files/data15/docs/2_Eric%20Higham_Strategy%20Analytics.pdf.*
U.S. Appl. No. 14/446,203, filed Jul. 29, 2014, enititled "Methods and Apparatuses for Atomic Layer Cleaning of Contacts and Vias."
US Office Action dated Jul. 21, 2015 issued in U.S. Appl. No. 14/446,203.
Kim, Jong Kyu, et al., (Nov./Dec. 2013) "Atomic layer etching removal of damaged layers in a contact hole for low sheet resistance," *Journal of Vacuum Science & Technology*, 31(6):8.
Metzler et al., (Mar./Apr. 2014) "Fluorocarbon assisted atomic layer etching of SiO2 using cyclic Ar/C4F8 plasma," *Journal of Vacuum Science & Technology A*, 32(2):5.
Oehrlein, Gottlieb S., "Atomic Layer Etching of $SiO_2$: Challenges and Opportunities*," *University of Maryland, Atomic Layer Etch and Atomic Layer Clean Technology Workshop*, San Francisco, Apr. 21, 2014, 22 pages.
US Notice of Allowance dated Feb. 5, 2016 issued in U.S. Appl. No. 14/446,203.
Volatier, M., et al., "Extremely High Aspect Ratio GaAs and GaAs/AlGaAs Nanowaveguides Fabricated Using Chlorine ICP Etching with $N_2$-Promoted Passivation," *Nanotechnology*, vol. 21, 2010, 134014, 8 pp.
US Office Action dated Nov. 29, 2017 issued in U.S. Appl. No. 15/421,189.
Taiwanese First Office Action dated Oct. 24, 2017 issued in TW 103126076.
Kanarik et al. (Mar./Apr. 2015) "Overview of atomic layer etching in the semiconductor industry," *J. Vac. Sci. Technol. A*, 33(2):020802-1-020802-14.
U.S. Appl. No. 15/841,205, filed Dec. 13, 2017, Kanarik.
International Search Report and Written Opinion dated Apr. 5, 2018, issued in Application No. PCT/US17/66470.

* cited by examiner

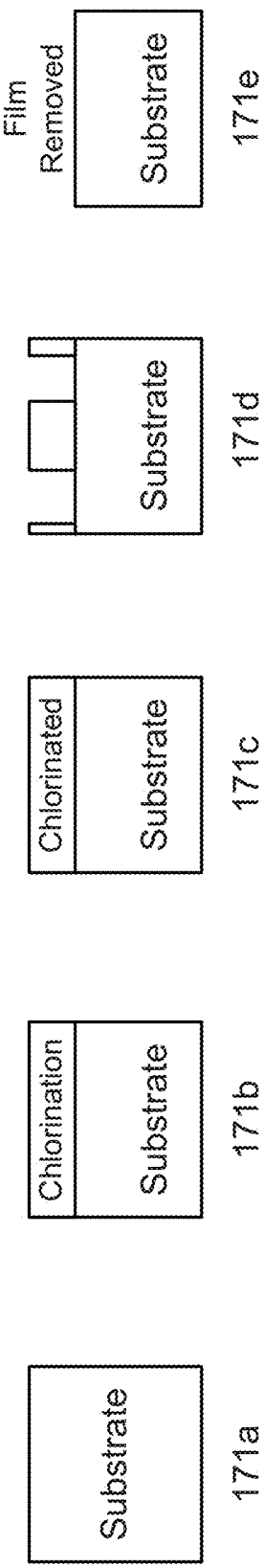

ATOMIC LAYER ETCHING OF GAN AND OTHER III-V MATERIALS

CROSS-REFERENCE TO RELATED APPLICATION

This application claims the benefit of U.S. Provisional Patent Application No. 62/171,570, filed Jun. 5, 2015, which is incorporated herein by reference and for all purposes.

BACKGROUND

Gallium nitride (GaN) is a binary wide bandgap III-V semiconductor used in high-electron-mobility transistors (HEMTs), light emitting diodes (LEDs), and ultraviolet (UV) detectors. In example applications, AlGaN/GaN HEMTs including n-type aluminum gallium nitride (AlGaN)/p-type GaN hetereojunctions may be used for high power-high efficiency industrial and automotive applications due to their high voltage, high current, and low on-resistance.

SUMMARY

Aspects of the disclosure relate to method of etching a III-V semiconductor material and related apparatus. In some embodiments, the methods involve exposing the III-V material to a chlorine-containing plasma without biasing the substrate to form a modified III-V surface layer and applying a bias voltage to the substrate while exposing the modified III-V surface layer to a plasma to thereby remove the modified III-V surface layer. In some embodiments, the operations of forming a modified III-V surface layer and removing the modified III-V surface layer may be repeated one or more times. In some embodiments, the bias voltage is lowered during the one or more times. In some embodiments, the bias voltage is at a level such that the removal is a self-limiting regime.

In some embodiments, the III-V material is GaN. In some embodiments, GaN is removed without removing an underlayer. Examples of underlayers include aluminum gallium nitride (AlGaN). In some embodiments, the bias voltage is at level such that the etch is selective to an underlying material.

In some embodiments, the bias voltage is between about 20 V and 120 V. In some embodiments, the bias voltage is between about 50 V and 120 V. In some embodiments, the bias voltage is between about 50 V and 100 V.

In some embodiments, the chlorine-containing plasma is generated from a mixture of a chlorine-containing gas and a boron-containing gas. In some embodiments, the chlorine-containing plasma is generated from a mixture of $Cl_2$ and $BCl_3$. In some embodiments, the plasma used to remove the modified layer is an argon-containing plasma.to an underlying material.

Another aspect of the disclosure is an apparatus for processing semiconductor substrates, the apparatus including a process chamber comprising a substrate support; a power supply connected to the substrate support; a plasma generator; and a controller having at least one processor and a memory, wherein the at least one processor and the memory are communicatively connected with one another, and the memory stores machine-readable instructions for introducing a chlorine-containing gas to the plasma generator; igniting a plasma in the plasma generator; exposing a substrate to a chlorine-containing gas to modify a III-V layer on the substrate; and using the power supply to apply a bias voltage to the substrate while exposing the substrate to the chlorine-containing plasma to remove the modified layer.

These and other aspects are described more fully below with reference to the figures.

BRIEF DESCRIPTION OF DRAWINGS

FIG. 1B shows an example schematic illustration of an atomic layer etching (ALE) cycle.

DETAILED DESCRIPTION

Figure 1A:
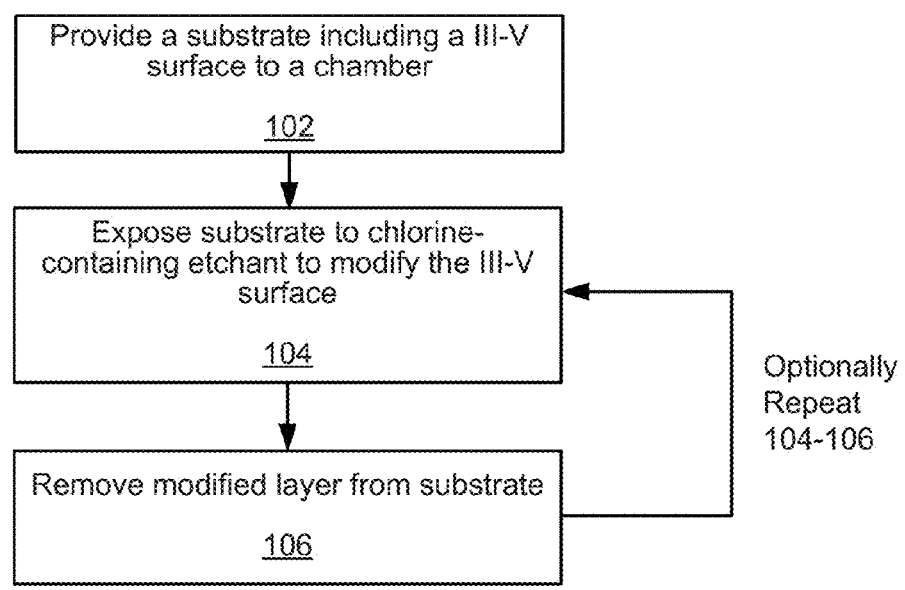
FIG. 1A provides a process flow diagram for performing operations in a method in accordance with disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

As feature sizes shrink, there is a growing need for atomic scale processing such as Atomic Layer Etch (ALE). ALE is a cyclic process of nominally self-limiting steps that results in digital and small changes in film thicknesses. The process may be characterized by smoothness and conformality, and also directionality in the case of some ALE.

Provided herein are ALE methods of removing III-V materials such as gallium nitride (GaN).

GaN is a binary wide bandgap III-V semiconductor used in high-electron-mobility transistors (HEMTs), light emitting diodes (LEDs), and ultraviolet (UV) detectors. In example applications, AlGaN/GaN HEMTs including n-type aluminum gallium nitride (AlGaN)/p-type GaN hetereojunctions may be used for high power-high efficiency industrial and automotive applications due to their high voltage, high current, and low on-resistance.

The disclosed methods are suitable for a wide range of applications, including etching processes for trenches and holes, fabrication of HEMTs, fabrication of LEDs, and improved selectivity in etching processes. While the below description refers chiefly to GaN, the techniques described may be used with other III-V semiconductor materials as described below.

ALE is a technique that removes thin layers of material using sequential self-limiting reactions. Generally, ALE may be performed using any suitable technique. Examples of atomic layer etch techniques are described in U.S. Pat. No. 8,883,028, issued on Nov. 11, 2014; and U.S. Pat. No. 8,808,561, issued on Aug. 19, 2014, which are herein incorporated by reference for purposes of describing example atomic layer etch and etching techniques. In various embodiments, ALE may be performed with plasma, or may be performed thermally.

The concept of an "ALE cycle" is relevant to the discussion of various embodiments herein. Generally an ALE cycle is the minimum set of operations used to perform an etch process one time, such as etching a monolayer. The result of one cycle is that at least some of a film layer on a substrate surface is etched. Typically, an ALE cycle includes a modification operation to form a reactive layer, followed by a removal operation to remove or etch only this modified layer. The cycle may include certain ancillary operations such as sweeping one of the reactants or byproducts. Generally, a cycle contains one instance of a unique sequence of operations. As an example, an ALE cycle may include the following operations: (i) delivery of a reactant gas and an optional plasma, (ii) purging of the reactant gas from the chamber, (iii) delivery of a removal gas and an optional plasma, and (iv) purging of the chamber. In some embodiments, etching may be performed nonconformally.

FIG. 1A provides a process flow diagram for performing operations in a method in accordance with disclosed embodiments. Operations in FIG. 1A may be performed at a chamber pressure between about 1 mTorr and about 100 Torr, e.g., about 1 mTorr and about 1 Torr. In operation 102, a substrate is provided to a processing chamber. The chamber may be a chamber in a multi-chamber apparatus or a single-chamber apparatus. The substrate may be a silicon wafer, e.g., a 200-mm wafer, a 300-mm wafer, or a 450-mm wafer, including wafers having one or more layers of material, such as dielectric, conducting, or semi-conducting material deposited thereon. The substrate includes an exposed surface of a III-V compound material.

A III-V material is a chemical compound with at least one group III element and at least one group V element. Examples of III-V compounds include binary semiconductors GaN, gallium phosphide (GaP), gallium arsenide (GaAs), and indium phosphide (InP). Compound III-V materials are high electron mobility materials that are under consideration as enablers in future devices to replace silicon. In some embodiments, the III-V material may include one or more additional elements. For example, III-V materials include ternary alloy III-Vs such as arsenides, phosphides, nitrides, and antimonides. Examples include indium gallium arsenide (InGaAs), indium aluminum arsenide (InAlAs), aluminum gallium nitride (AlGaN) and aluminum gallium arsenide (AlGaAs). It should be understood that the formulas GaN, GaP, GaAs, AlGaN, etc. do not denote any particular ratio of the constituent elements.

In some embodiments, the substrate includes a blanket layer of the III-V compound. The substrate may include a patterned mask layer previously deposited and patterned on the substrate. For example, a mask layer may be deposited and patterned on a substrate including a blanket III-V compound.

In operation 104 of FIG. 1A, the substrate is exposed to a chlorine (Cl)-containing reactant to modify the III-V surface. According to various embodiments, the chlorine-containing reactant may be chlorine ($Cl_2$), boron trichloride ($BCl_3$), or a combination thereof. As discussed further below, in some embodiments, a mixture of $Cl_2$ and $BCl_3$ is used. Other Cl-containing gases may be used in addition to or instead of these according to certain embodiments. As noted below, in some embodiments, a plasma may be ignited in operation 104, which may generate various activated species from $Cl_2$, $BCl_3$, or other chlorine-containing gas.

References herein to a Cl-containing gas are understood to include species generated from such a gas. According to various embodiments, the plasma may be controlled such that the activated species in the chamber during operation 104 are primarily or substantially radical species. In some embodiments, essentially no ionic species are in the chamber.

During operation 104, a carrier gas may be optionally flowed, while a Cl-containing etching gas is flowed to the chamber. Examples of carrier gases include nitrogen ($N_2$), argon (Ar), neon (Ne), helium (He), and combinations thereof.

The modification operation forms a thin, reactive surface layer with a thickness that is more easily removed than the un-modified material in the subsequent removal operation. In a modification operation, a substrate may be chlorinated by introducing a chlorine-containing reactant into the chamber. In some embodiments, the chlorine-containing reactant may react with the substrate or may be adsorbed onto the surface of the substrate. In various embodiments, chlorine is introduced into the chamber in a gaseous form and may be optionally accompanied by a carrier gas which may be any of those described above. In some embodiments, a carrier gas is not flowed during surface modification. The reactant may be flowed such that it modifies only the top surface of the substrate.

In some embodiments, a plasma may be ignited during operation 104. A chlorine-containing plasma can be generated directly by forming a plasma in the process chamber housing the substrate or it can be generated remotely in a process chamber that does not house the substrate, and can be supplied into the process chamber housing the substrate. In some embodiments, a plasma is not used with the modification operation being a purely thermal process. In some embodiments, another form of activation energy may be employed during operation 104. Examples include exposure to ultraviolet (UV) radiation. Generating radical species during operation 104 can significantly improve throughput in some embodiments.

If employed, according to various embodiments, the plasma may be an inductively coupled plasma or a capacitively coupled plasma. An inductively coupled plasma may be set at a plasma between about 50 W and about 2000 W. While a substrate bias may be applied, more typically no bias is applied during operation 104 to avoid sputtering.

In some embodiments, a purge may be performed after a modification operation. In a purge operation, non-surface-bound active chlorine species may be removed from the process chamber. This can be done by purging and/or evacuating the process chamber to remove the active species, without removing the modified layer. The species generated in a chlorine plasma can be removed by simply stopping the plasma and allowing the remaining species decay, optionally combined with purging and/or evacuation of the chamber. Purging can be done using any inert gas such as $N_2$, Ar, Ne, He and their combinations.

In operation 106, the modified layer of the substrate is removed from the substrate. In a removal operation, the substrate may be exposed to an energy source (e.g. activating or sputtering gas or chemically reactive species that induces removal), such as argon or helium, to etch the substrate by directional sputtering. A sputtering gas may be the same as or different from a carrier gas. In some embodiments, the removal operation may be performed by ion bombardment. During removal, a bias may be optionally turned on to facilitate directional sputtering. In some embodiments, ALE may be isotropic.

The amount of sputtering gas may be controlled such as to etch only a targeted amount of material. In various embodiments, the pressure of the chamber may vary between the modification and removal operations. The pressure of the gas may depend on the size of the chamber, the flow rate of the gas, the temperature of the reactor, the type of substrate, and the size of substrate to be etched. Substrate bias levels are discussed further below with respect to FIGS. 1C and 1D. In some embodiments, the chamber may be purged after a removal operation. Purge processes may be any of those used for a purge after a modification operation. Operation 106 may take place in the same or different chamber as operation 104 according to various embodiments.

In some embodiments, the plasma in operation 106 is an inert plasma. An inert plasma is a plasma that contains substantially no chemically reactive species such as oxygen or halogens. Examples of inert plasmas include argon plasmas and helium plasmas.

As described herein, in operations where materials are introduced into the chamber, in some embodiments involving atomic layer etch using a plasma, the reactor or chamber may be stabilized by introducing the chemistry into the chamber prior to processing the substrate or wafer. Stabilizing the chamber may use the same flow rates, pressure, temperatures, and other conditions as the chemistry to be used in the operation following the stabilization. In some embodiments, stabilizing the chamber may involve different parameters. In some embodiments, a carrier gas, such as N2, Ar, Ne, He, and combinations thereof, is continuously flowed during operations 104 and 106. In some embodiments, a carrier gas is only used during operation 106. In some embodiments, a carrier gas is not flowed during removal.

Performing operations 104 and 106 may, in some embodiments, constitute performing atomic layer etch once. If the III-V material is not sufficiently etched, operations 104 and 106 may be repeated. In various embodiments, the modification and removal operations may be repeated in cycles, such as about 1 to about 30 cycles, or about 1 to about 20 cycles. Any suitable number of ALE cycles may be included to etch a desired amount of film. In some embodiments, ALE is performed in cycles to etch about 1 Å to about 50 Å of the surface of the layers on the substrate. In some embodiments, cycles of ALE etch between about 2 Å and about 50 Å of the surface of the layers on the substrate.

FIG. 1B shows an example schematic illustration of an ALE cycle. In 171a, a substrate including a III-V surface is provided. In 171b, the surface of the substrate is modified to form a reactive layer. In the example of FIG. 1B, this involves chlorination of the III-V surface, for example, by adsorption of chlorine onto the surface of the substrate. In 171c, excess chlorine-containing reactant gas may be purged from the chamber. In 171d, the chlorinated layer of the III-V compound is being etched. In an example, an argon removal gas is introduced with a directional plasma and ion bombardment is performed to remove the chlorinated surface of the substrate. The substrate is shown with the chlorinated layer removed in 171e.

A cycle may only partially etch about 0.1 nm to about 50 nm of material, or between about 0.1 nm and about 5 nm of material, or between about 0.2 nm and about 50 nm of material, or between about 0.2 nm and about 5 nm of material.

In various embodiments, process conditions, such as pedestal temperature, chamber temperature, chamber pressure, gas flow rates, gas flow chemistry, duration of pulses, exposures, and purges, plasma frequency, plasma power, and bias power, may be adjusted depending on the type of application and the type of apparatus or tool upon which the disclosed embodiments are implemented.

The ALE processes described herein provide significantly smoother surfaces than continuous wave plasmas that use the same chemistries under comparable process conditions. This can be advantageous for applications such as HEMTs.

Figure 1C:
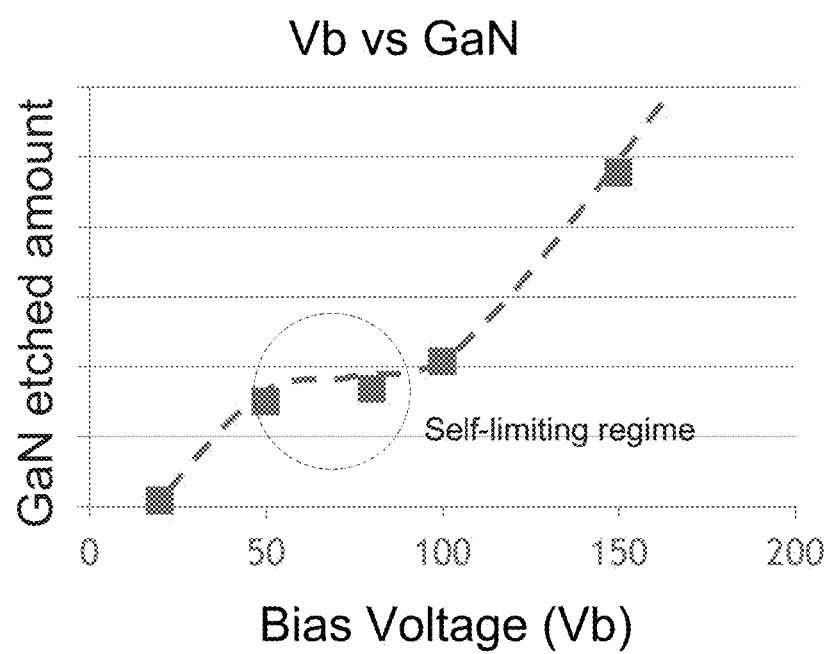
FIG. 1C shows an example of a bias voltage (Vb) vs. etched amount curve for ALE of GaN using $Cl_2$ and Ar, with the bias applied during the Ar removal

In some embodiments, a substrate bias is applied during a removal operation. A bias level may set to be below a level at which the etch rate significantly increases due to sputtering by Ar ions or other removal species. In some embodiments, a bias level is set such that the removal is in a self-limiting regime. FIG. 1C shows an example of a bias voltage (Vb) vs. etched amount curve for ALE of GaN using $Cl_2$ and Ar, with the bias applied during the Ar removal. The curve shows that between approximately 50 V and 80 V, the removal is in a self-limiting regime. Above about 100 V, the etch rate increases sharply, indicating Ar sputtering. For etching to occur, the bias voltage is set above a threshold voltage in this case, about 20 V. Accordingly, in various embodiments, the bias voltage is maintained between a threshold voltage and a voltage at which sputtering occurs. Further in some embodiments, the bias voltage is maintained in a self-limiting regime for at least some cycles of the ALE process. A self-limiting regime may be determined for any particular surface to be etched and etch process conditions as shown in FIG. 1C for GaN.

In some embodiments, the bias voltage may be lowered toward the end of the etch process. For example, at 0.5 nm, 1 nm, or other appropriate amount left to etch, the bias voltage may be lowered. In some embodiments, the bias voltage may be modified to a voltage that provides high selectivity to an underlying material. Controlling selectivity using bias voltage is discussed further below with respect to FIG. 1D. If a bias is applied during the removal step, it may be constant or pulsed. Pulsed biasing can be applied at high frequencies (e.g., 1 kHz).

Figure 1D:
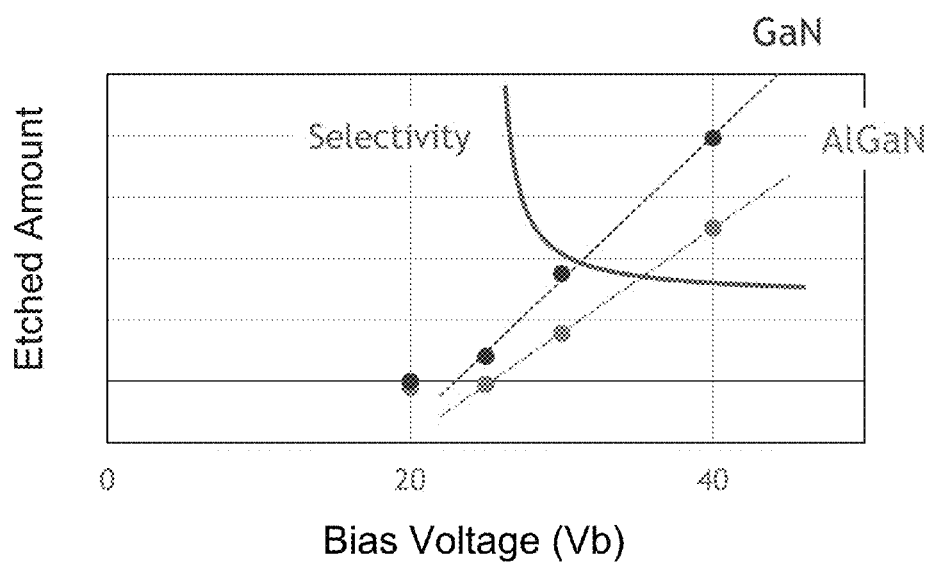
FIG. 1D shows GaN/AlGaN etch selectivity as a function of bias voltage.
Figure 1E:
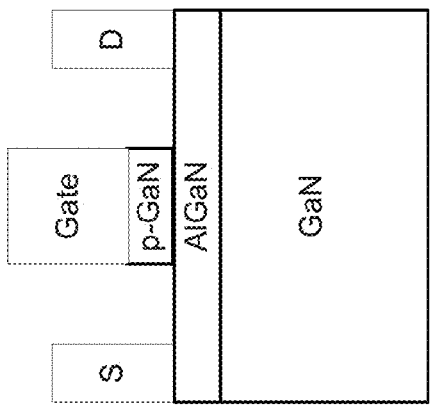
FIG. 1E illustrates certain operations in fabricating a GaN HEMT device, including a GaN/AlGaN heterojunction.
Figure 1E:
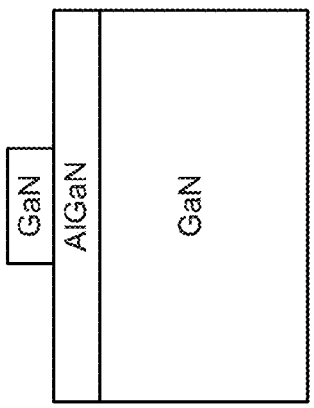
Figure 1E:
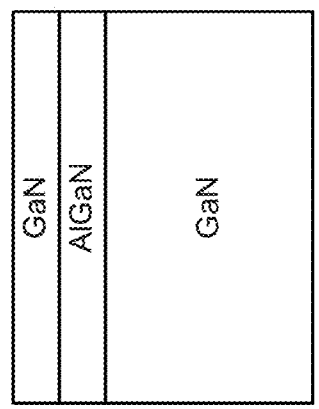

Also provided herein are methods of selectively etching GaN and other III-V compound materials relative to harder materials by controlling ion energies. Ion energies may be controlled by any appropriate method, for example by controlling bias voltage. In some embodiments, selectivity of infinity may be obtained. FIG. 1D shows GaN/AlGaN etch selectivity as a function of bias voltage. Around the AlGaN threshold voltage of 25 V, GaN/AlGaN selectivity goes toward infinity. A difference in threshold voltages may be exploited to achieve etch selectivity for other III-V compounds as well. FIG. 1E illustrates certain operations in fabricating a GaN HEMT device, including a GaN/AlGaN heterojunction. GaN is etched selective to AlGaN. ALE of GaN is performed to provide a damage free, highly selective etch.

Due to their more complicated surfaces, ALE of compound III-V materials may more challenging than that of silicon, for example, in terms of maintaining stoichiometry. For many applications, it is desirable to have the surface stoichiometry nearly identical to that of the bulk to keep electronic properties from degrading. Embodiments of the methods disclosed herein include ALE of III-V materials that tailor the surface stoichiometry. In some embodiments, the pre-etch surface stoichiometry is maintained. In some embodiments, the methods include using a mixture of $Cl_2$ and a boron-containing compound, such as $BCl_3$. Without being bound a particular theory, it is believed that the addition of boron may prevent unwanted oxidation of a surface. However, too much boron may lead to deposition.

In some embodiments, the $Cl_2/BCl_3$ mixture is between 0.5% and 10% (volumetric) $BCl_3$, e.g., about 5% $BCl_3$. The addition of $BCl_3$ may improve surface roughness.

Apparatus

Inductively coupled plasma (ICP) reactors which, in certain embodiments, may be suitable for atomic layer etching (ALE) operations are now described. Such ICP reactors have also described in U.S. Patent Application Publication No. 2014/0170853, filed Dec. 10, 2013, and titled "IMAGE REVERSAL WITH AHM GAP FILL FOR MULTIPLE PATTERNING," hereby incorporated by reference in its entirety and for all purposes. Although ICP reactors are described herein, in some embodiments, it should be understood that capacitively coupled plasma reactors may also be used.

Figure 2:
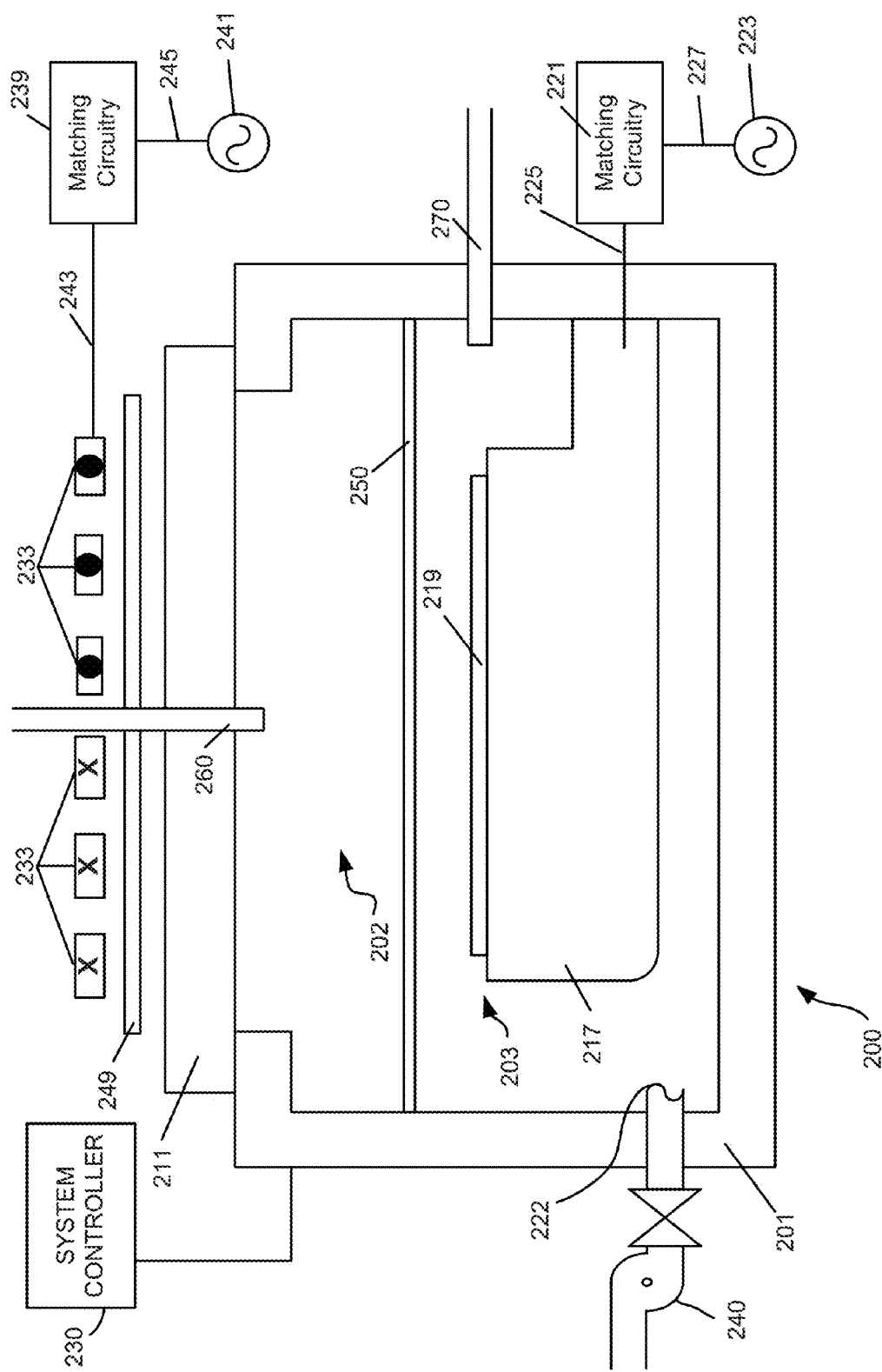
FIG. 2 schematically shows a cross-sectional view of an inductively coupled plasma apparatus appropriate for implementing certain embodiments herein.

FIG. 2 schematically shows a cross-sectional view of an inductively coupled plasma apparatus 200 appropriate for implementing certain embodiments herein, an example of which is a Kiyo™ reactor, produced by Lam Research Corp. of Fremont, Calif. The inductively coupled plasma apparatus 200 includes an overall process chamber structurally defined by chamber walls 201 and a window 211. The chamber walls 201 may be fabricated from stainless steel or aluminum. The window 211 may be fabricated from quartz or other dielectric material. An optional internal plasma grid 250 divides the overall processing chamber into an upper sub-chamber 202 and a lower sub-chamber 203. In most embodiments, plasma grid 250 may be removed, thereby utilizing a chamber space made of upper sub-chamber 202 and lower sub-chamber 203. A chuck 217 is positioned within the lower sub-chamber 203 near the bottom inner surface. The chuck 217 is configured to receive and hold a semiconductor wafer 219 upon which the etching and deposition processes are performed. The chuck 217 can be an electrostatic chuck for supporting the wafer 219 when present. In some embodiments, an edge ring (not shown) surrounds chuck 217, and has an upper surface that is approximately planar with a top surface of a wafer 219, when present over chuck 217. The chuck 217 also includes electrostatic electrodes for chucking and dechucking the wafer. A filter and DC clamp power supply (not shown) may be provided for this purpose. Other control systems for lifting the wafer 219 off the chuck 217 can also be provided. The chuck 217 can be electrically charged using an RF power supply 223. The RF power supply 223 is connected to matching circuitry 221 through a connection 227. The matching circuitry 221 is connected to the chuck 217 through a connection 225. In this manner, the RF power supply 223 is connected to the chuck 217.

Elements for plasma generation include a coil 233 is positioned above window 211. In some embodiments, a coil is not used in disclosed embodiments. The coil 233 is fabricated from an electrically conductive material and includes at least one complete turn. The example of a coil 233 shown in FIG. 2 includes three turns. The cross-sections of coil 233 are shown with symbols, and coils having an "X" extend rotationally into the page, while coils having a "●" extend rotationally out of the page. Elements for plasma generation also include an RF power supply 241 configured to supply RF power to the coil 233. In general, the RF power supply 241 is connected to matching circuitry 239 through a connection 245. The matching circuitry 239 is connected to the coil 233 through a connection 243. In this manner, the RF power supply 241 is connected to the coil 233. An optional Faraday shield 249 is positioned between the coil 233 and the window 211. The Faraday shield 249 is maintained in a spaced apart relationship relative to the coil 233. The Faraday shield 249 is disposed immediately above the window 211. The coil 233, the Faraday shield 249, and the window 211 are each configured to be substantially parallel to one another. The Faraday shield may prevent metal or other species from depositing on the dielectric window of the plasma chamber.

Process gases (e.g. chlorine, boron trichloride, argon, nitrogen, etc.) may be flowed into the processing chamber through one or more main gas flow inlets 260 positioned in the upper chamber and/or through one or more side gas flow inlets 270. Likewise, though not explicitly shown, similar gas flow inlets may be used to supply process gases to a capacitively coupled plasma processing chamber. A vacuum pump, e.g., a one or two stage mechanical dry pump and/or turbomolecular pump 240, may be used to draw process gases out of the process chamber and to maintain a pressure within the process chamber. For example, the pump may be used to evacuate the chamber during a purge operation of ALE. A valve-controlled conduit may be used to fluidically connect the vacuum pump to the processing chamber so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus, one or more process gases may be supplied through the gas flow inlets 260 and/or 270. In certain embodiments, process gas may be supplied only through the main gas flow inlet 260, or only through the side gas flow inlet 270. In some cases, the gas flow inlets shown in the figure may be replaced more complex gas flow inlets, one or more showerheads, for example. The Faraday shield 249 and/or optional grid 250 may include internal channels and holes that allow delivery of process gases to the chamber. Either or both of Faraday shield 249 and optional grid 250 may serve as a showerhead for delivery of process gases. In some embodiments, a liquid vaporization and delivery system may be situated upstream of the chamber, such that once a liquid reactant is vaporized, the vaporized reactant is introduced into the chamber via a gas flow inlet 260 and/or 270. Example liquid reactants include $SiCl_4$.

Radio frequency power is supplied from the RF power supply 241 to the coil 233 to cause an RF current to flow through the coil 233. The RF current flowing through the coil 233 generates an electromagnetic field about the coil 233. The electromagnetic field generates an inductive current within the upper sub-chamber 202. The physical and chemical interactions of various generated ions and radicals with the wafer 219 selectively etch features of layers on the wafer.

If the plasma grid is used such that there is both an upper sub-chamber 202 and a lower sub-chamber 203, the inductive current acts on the gas present in the upper sub-chamber 202 to generate an electron-ion plasma in the upper sub-chamber 202. The optional internal plasma grid 250 limits the amount of hot electrons in the lower sub-chamber 203. In some embodiments, the apparatus is designed and operated such that the plasma present in the lower sub-chamber 203 is an ion-ion plasma.

Both the upper electron-ion plasma and the lower ion-ion plasma may contain positive and negative ions, through the ion-ion plasma will have a greater ratio of negative ions to positive ions. Volatile etching and/or deposition byproducts may be removed from the lower-sub-chamber 203 through port 222. The chuck 217 disclosed herein may operate at elevated temperatures ranging between about 10° C. and about 250 ° C. The temperature will depend on the process operation and specific recipe.

Chamber 201 may be coupled to facilities (not shown) when installed in a clean room or a fabrication facility. Facilities include plumbing that provide processing gases, vacuum, temperature control, and environmental particle control. These facilities are coupled to the chamber, when installed in the target fabrication facility. Additionally, the chamber may be coupled to a transfer chamber that allows robotics to transfer semiconductor wafers into and out of the chamber using typical automation.

In some embodiments, a system controller 230 (which may include one or more physical or logical controllers) controls some or all of the operations of a processing chamber. The system controller 230 may include one or more memory devices and one or more processors. In some embodiments, the apparatus includes a switching system for controlling flow rates and durations when disclosed embodiments are performed. In some embodiments, the apparatus may have a switching time of up to about 500 ms, or up to about 750 ms. Switching time may depend on the flow chemistry, recipe chosen, reactor architecture, and other factors.

In some implementations, a controller 230 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 230, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 230 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 230, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 230 receives instructions in the form of data, which specify parameters for each of the processing steps to be performed during one or more operations. It should be understood that the parameters may be specific to the type of process to be performed and the type of tool that the controller is configured to interface with or control. Thus as described above, the controller 230 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 3:
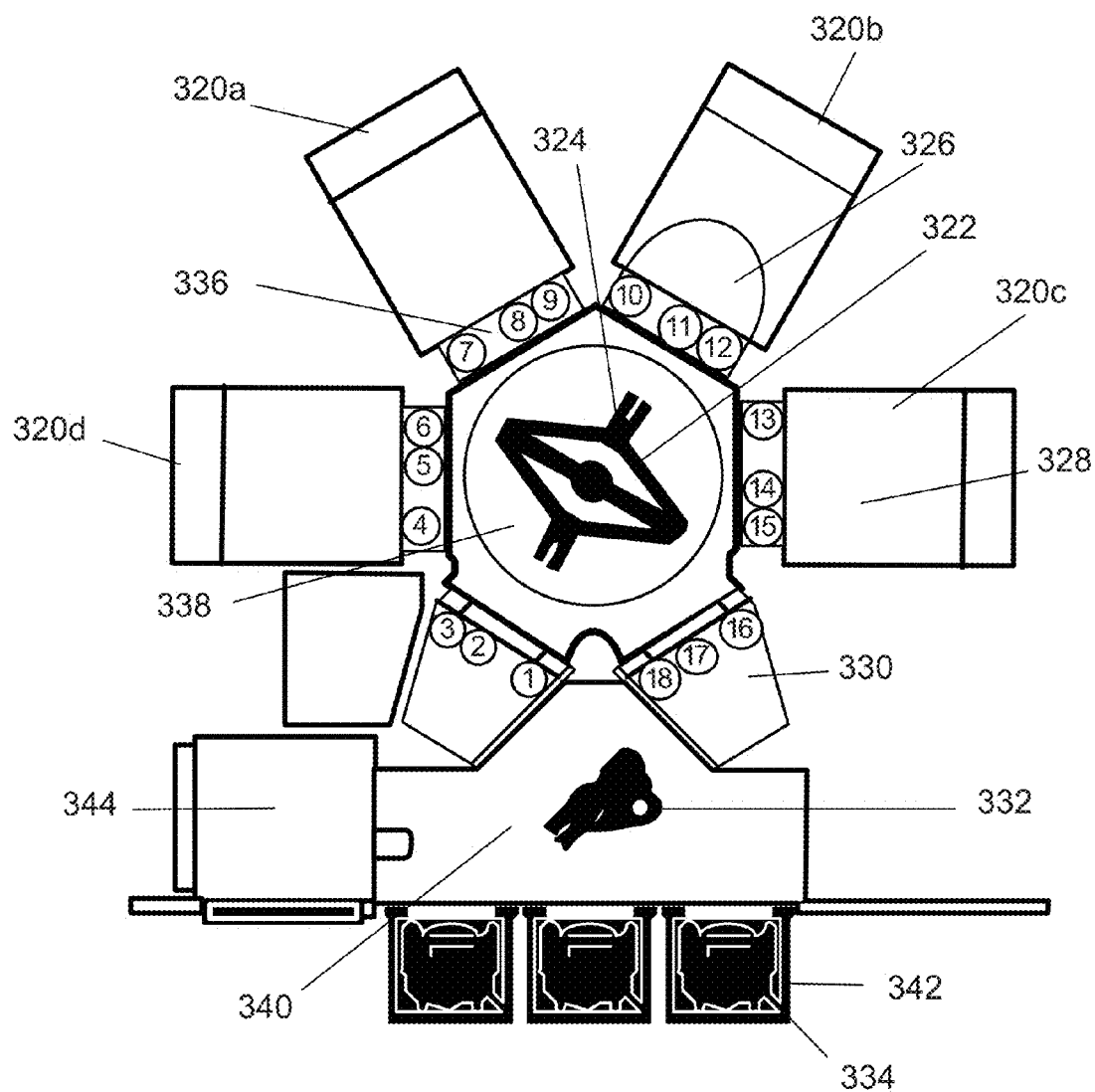
FIG. 3 depicts a semiconductor process cluster architecture with various modules that interface with a vacuum transfer module.

FIG. 3 depicts a semiconductor process cluster architecture with various modules that interface with a vacuum transfer module 338 (VTM). The arrangement of transfer modules to "transfer" wafers among multiple storage facilities and processing modules may be referred to as a "cluster tool architecture" system. Airlock 330, also known as a loadlock, transfer module or airlock module 330, is shown in VTM 338 with four processing modules 320a-320d, which may be individual optimized to perform various fabrication processes. By way of example, processing modules 320a-320d may be implemented to perform substrate etching, deposition, ion implantation, wafer cleaning, sputtering, and/or other semiconductor processes. For example, in some embodiments, an ALD process may be performed in the same module as an ALE process. In some embodiments, ALD and ALE are performed in different modules of the same tool. One or more of the substrate etching processing modules (any of 320a-320d) may be implemented as disclosed herein, i.e., for depositing conformal films, selectively depositing films by ALD, etching patterns, and other suitable functions in accordance with the disclosed embodiments. Airlock 330 and each of processing modules 320a-320d may be referred to as "stations." Each station has a facet 336 that interfaces the station to VTM 338. Inside each facet, sensors 1-18 are used to detect the passing of wafer 326 when moved between respective stations.

Robot 322 transfers wafer 326 between stations. In one embodiment, robot 322 has one arm, and in another embodiment, robot 322 has two arms, where each arm has an end effector 324 to pick wafers such as wafer 326 for transport. Front-end robot 332, in atmospheric transfer module (ATM) 340, is used to transfer wafers 326 from cassette or Front Opening Unified Pod (FOUP) 334 in Load Port Module (LPM) 342 to airlock 330. Module center 328 inside process module 320 is one location for placing wafer 326. Aligner 344 in ATM 340 is used to align wafers.

In an exemplary processing method, a wafer is placed in one of the FOUPs 334 in the LPM 342. Front-end robot 332 transfers the wafer from the FOUP 334 to an aligner 344, which allows the wafer 326 to be properly centered before it is etched or processed. After being aligned, the wafer 326 is moved by the front-end robot 332 into an airlock 330. Because airlock modules have the ability to match the environment between an ATM and a VTM, the wafer 326 is able to move between the two pressure environments without being damaged. From the airlock module 330, the wafer 326 is moved by robot 322 through VTM 338 and into one of the process modules 320a-320d. In order to achieve this wafer movement, the robot 322 uses end effectors 324 on each of its arms. Once the wafer 326 has been processed, it is moved by robot 322 from the process modules 320a-320d to an airlock module 330. From here, the wafer 326 may be moved by the front-end robot 332 to one of the FOUPs 334 or to the aligner 344.

It should be noted that the computer controlling the wafer movement can be local to the cluster architecture, or can be located external to the cluster architecture in the manufacturing floor, or in a remote location and connected to the cluster architecture via a network. A controller as described above with respect to FIG. 2 may be implemented with the tool in FIG. 3.

EXPERIMENTAL

A blanket layer of GaN was etched by ALE. ALE chemistry was Cl2 modification and Ar removal, with 50 V bias during the removal. 22 nm of GaN was etched using repeated ALE cycles. RMS roughness post ALE etch was slightly improved compared to before etching.

GaN ALE ($Cl_2$/Ar) was compared to a Cl-only etch on GaN and an Ar-only sputter etch on GaN. The Cl-only etch resulted in no GaN etch (100 cycles). The ALE etch resulted in nearly an order of magnitude more etching than the Ar sputter alone. This result indicates that there is a strong synergistic effect in the ALE process and supports that an ALE mechanism as described above is occurring.

AlGaN surface smoothness was measured after ALE processes using various mixtures of $Cl_2/BCl_3$. Mixtures having 0%/100%, 5%/95%, 15%/85%, and 100%/0% percent $BCl_3/Cl_2$ were used. Roughness was improved with $BCl_3$ concentration.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of etching a III-V material on a substrate, comprising:
    a) exposing the III-V material to a chlorine-containing plasma without biasing the substrate to form a modified III-V surface layer, wherein the chlorine-containing plasma includes essentially no ionic species; and
    b) applying a bias voltage to the substrate while exposing the modified III-V surface layer to an inert plasma to thereby remove the modified III-V surface layer.

2. The method of claim 1, further comprising repeating (a) and (b) one or more times.

3. The method of claim 1, wherein the bias voltage is at a level such that the removal is in a self-limiting regime.

4. The method of claim 1, wherein the chlorine-containing plasma is generated from a process gas including a boron-containing compound, wherein about 0.5% to 10% (volumetric) of the process gas is the boron-containing compound.

5. The method of claim 1, further comprising performing one or more additional cycles of (a) and (b), wherein the bias voltage is lowered during the one or more additional cycles.

6. The method of claim 1, wherein the III-V material is GaN.

7. The method of claim 6, wherein GaN is removed without removing an underlayer.

8. The method of claim 7, wherein the underlayer is AlGaN.

9. The method of claim 1, wherein the bias voltage is between about 20 V and 120 V.

10. The method of claim 1, wherein the bias voltage is between about 50 V and 120 V.

11. The method of claim 1, wherein the bias voltage is between about 50 V and 100 V.

12. The method of claim 1, wherein the chlorine-containing plasma is generated from a mixture of a chlorine-containing gas and a boron-containing gas.

13. The method of claim 1, wherein the chlorine-containing plasma is generated from a mixture of a $Cl_2$ and $BCl_3$.

14. The method of claim 1, wherein the inert plasma in (b) is an argon-containing plasma.

15. The method of claim 1, wherein the bias voltage is at level such that the etch is selective to an underlying material.

16. A method of etching a III-V material on a substrate, comprising:
    a) exposing the III-V material to a chlorine-containing plasma without biasing the substrate to form a modified III-V surface layer, wherein the chlorine-containing plasma is generated from a mixture of $Cl_2$ and $BCl_3$, wherein about 0.5% to 10% (volumetric) of the mixture is $BCl_3$ and the remainder is $Cl_2$; and
    b) applying a bias voltage to the substrate while exposing the modified III-V surface layer to an inert plasma to thereby remove the modified III-V surface layer.

17. The method of claim 16, wherein about 5% of the mixture is $BCl_3$.

18. A method of selectively etching a first III-V material relative to a second III-V material that underlies the first III-V on a substrate, comprising:
 (a) exposing the first III-V material to a chlorine-containing plasma without biasing the substrate to form a first modified III-V surface layer,
 (b) applying a first bias voltage to the substrate while exposing the first modified III-V surface layer to an inert plasma to thereby remove the first modified III-V surface layer,
 (c) after (b), exposing the first III-V material to a chlorine-containing plasma without biasing the substrate to form a second modified III-V surface layer,
 (d) applying a second bias voltage to the substrate while exposing the second modified III-V surface layer to an inert plasma to thereby remove the second modified III-V surface layer, wherein the second bias voltage is lower than the first bias voltage.

19. The method of claim 18, wherein at the first bias voltage, the etch selectivity of the first III-V material relative to the second III-V material is less than infinity.

20. The method of claim 19, wherein at the second bias voltage, the etch selectivity of the first III-V material relative to the second III-V material is infinity.

* * * * *